United States Patent
Yu et al.

(10) Patent No.: US 9,640,363 B2
(45) Date of Patent: May 2, 2017

(54) NANO-PATTERNED SYSTEM AND MAGNETIC-FIELD APPLYING DEVICE THEREOF

(71) Applicant: Institute Of Physics, Chinese Academy Of Sciences, Beijing (CN)

(72) Inventors: Guoqiang Yu, Beijing (CN); Peng Guo, Beijing (CN); Xiufeng Han, Beijing (CN); Chaohui Guo, Beijing (CN); Xiaoyu Sun, Beijing (CN); Xiangqian Zhou, Beijing (CN)

(73) Assignee: Institute Of Physics, Chinese Academy Of Sciences, Beijing (CN)

(*) Notice: Subject to any disclaimer, the term of this patent is extended or adjusted under 35 U.S.C. 154(b) by 0 days.

(21) Appl. No.: 15/282,028

(22) Filed: Sep. 30, 2016

(65) Prior Publication Data

US 2017/0018395 A1 Jan. 19, 2017

Related U.S. Application Data

(62) Division of application No. 14/389,972, filed as application No. PCT/CN2012/078751 on Jul. 17, 2012, now Pat. No. 9,484,138.

(30) Foreign Application Priority Data

Apr. 1, 2012 (CN) .......................... 2012 1 0096470

(51) Int. Cl.
*H01J 37/09* (2006.01)
*H01F 41/00* (2006.01)
(Continued)

(52) U.S. Cl.
CPC ............ *H01J 37/09* (2013.01); *G01R 33/093* (2013.01); *G01R 33/096* (2013.01); *H01F 7/202* (2013.01);
(Continued)

(58) Field of Classification Search
CPC ......... H01L 43/12; H01F 7/204; H01F 41/00; H01J 37/09; G01R 33/093; G01R 33/096
See application file for complete search history.

(56) References Cited

U.S. PATENT DOCUMENTS 5,539,366 A   7/1996  Dorri
6,459,272 B1  10/2002 Yamashita
(Continued)

FOREIGN PATENT DOCUMENTS

CN   1527358   9/2004
CN   1584616   2/2005
(Continued)

OTHER PUBLICATIONS

International Search Report of PCT/CN2012/078751 dated Jan. 10, 2013.

*Primary Examiner* — Bernard Rojas
(74) *Attorney, Agent, or Firm* — Mayback & Hoffman, P.A.; Gregory L. Mayback; Rebecca A. Tie

(57) ABSTRACT

A nano-patterned system comprises a vacuum chamber, a sample stage and a magnetic-field applying device, which comprises a power supply, a magnetic-field generation device and a pair of magnetic poles. The magnetic-field generation device comprises a coil and a magnetic conductive soft iron core. The power supply is connected to the coil, which is wound on the soft iron core to generate a magnetic field. The soft iron core is of a semi-closed frame structure and the magnetic poles are at the ends of the frame structure. The stage is inside a vacuum chamber. The poles are oppositely arranged inside the vacuum chamber relative to the stage. The coil and the soft iron core are outside the vacuum chamber. The soft iron core leads the magnetic field generated by the coil into the vacuum chamber. The magnetic poles locate a sample on the stage and apply a local magnetic field.

13 Claims, 7 Drawing Sheets

(51) Int. Cl.
    *G01R 33/09*         (2006.01)
    *H01L 43/12*         (2006.01)
    *H01F 7/20*          (2006.01)
    *H01J 37/141*       (2006.01)

(52) U.S. Cl.
    CPC ............ *H01F 7/204* (2013.01); *H01F 41/00* (2013.01); *H01J 37/141* (2013.01); *H01L 43/12* (2013.01); *H01J 2237/0262* (2013.01); *H01J 2237/0264* (2013.01); *H01J 2237/28* (2013.01); *H01J 2237/31754* (2013.01)

(56) References Cited

U.S. PATENT DOCUMENTS

| | | |
|---|---|---|
| 7,183,763 B1 | 2/2007 | Murata |
| 2004/0173755 A1 | 9/2004 | Moon |

FOREIGN PATENT DOCUMENTS

| | | |
|---|---|---|
| CN | 202533709 | 11/2012 |
| JP | 2004158612 | 6/2004 |
| TW | 586010 | 5/2004 |

NANO-PATTERNED SYSTEM AND MAGNETIC-FIELD APPLYING DEVICE THEREOF

CROSS-REFERENCE TO RELATED APPLICATIONS

This application is a divisional application of U.S. Ser. No. 14/389,972 filed Dec. 18, 2014, which application is a continuing application under 35 U.S.C. §120 of international application No. PCT/CN2012/078751, filed Jul. 17, 2012, which designated the United States and was not published in English and claimed priority, under 35 U.S.C. §119, of China patent application No. 201210096470.3 filed on Apr. 1, 2012; the prior applications are herewith incorporated by reference in their entireties.

STATEMENT REGARDING FEDERALLY SPONSORED RESEARCH OR DEVELOPMENT

Not Applicable

FIELD OF THE INVENTION

The present invention relates to a nano-patterned and magneto-electric high-frequency characteristic measurement system, and particularly to a micro/nano-patterned system for measuring and studying the magneto-electric response characteristics of a micro/nano-patterned device as well as a magnetic-field applying device thereof.

BACKGROUND OF THE INVENTION

Since Giant Magnetoresistance (GMR) Effect and Tunneling Magnetoresistance (TMR) Effect were discovered in 1988, with the progress of the preparation of nanometer thin film materials and the micro/nano-processing technology, spinning electronics as an emerging discipline has developed rapidly and has greatly boosted the development of information science. Currently, nano-magnetic materials and devices have been widely used in many fields, including, for example, the fields of electronics, magnetics, chemistry and biology, etc. The study of nano-magnetic materials and devices has become one of the core issues of condensed matter physics and modern information technology as well as industrial production. This also means that the study of nano-magnetic materials and devices has become a complete process of comprehensive measurement and analysis, comprising nanometer microstructure imaging and nano-patterning and involving magnetic or electric fields.

At present, the Electron Beam Lithography (EBL) System is one of the important pieces of equipment for integration of the preparation and observation of nanostructures. It comprises a scanning electron microscopy (SEM) imaging function and an electron beam pattern generator, i.e., it writes nano-patterns directly on a resist layer using a focused electron beam. As the electron beam is characterized by a small beam spot and high energy, nanostructures with a line width of 5 to 10 nm can be produced by using an EBL system. This is the ideal method for making nano materials and devices. Currently, the world record of the production of nanostructures with a minimum line width of less than 5 nm was set by Raith GmbH (Germany) and has been held by it so far. Although some EBL systems have been integrated with probe arms having a function of measuring electrical signals, the existing EBL systems are unable to make the direct observation of nano materials and devices compatible with the manipulation and measurement of in-situ electrical/magnetic signals. This bottleneck problem is caused mainly from the fact that the electrons used for exposure and imaging in an EBL system will deflect under the action of an external magnetic or electric field applied for the in-situ measurement of a sample, which will seriously interfere with and influence the focusing and scanning of an electron beam. To solve the above problem, we have proposed the introduction of a magnetic field into an EBL system in the Chinese utility model patent No. 201120265595.5, entitled "NANO-PATTERNED AND ULTRA-WIDEBAND ELECTROMAGNETIC CHARACTERISTIC MEASUREMENT SYSTEM". However, such magnetic-field generation device is unable to locate or introduce a magnetic/electric field in a local region.

SUMMARY OF THE INVENTION

The technical problem to be solved by the present invention is to provide a nano-patterned system and a magnetic-field applying device thereof, which are able to locate and introduce a magnetic field in a local region on the basis of an imaging function, such as a SEM imaging or EBL patterning function.

To this end, the present invention provides a magnetic-field applying device of a nano-patterned system, comprising a power supply, a magnetic-field generation device and a pair of magnetic poles, wherein the magnetic-field generation device comprises a coil and a magnetic conductive soft iron core, the power supply is connected to the coil, the coil is wound on the magnetic conductive soft iron core to generate a magnetic field, the magnetic conductive soft iron core is of a semi-closed frame structure, the magnetic poles are respectively arranged at the two ends of the semi-closed frame structure, a sample stage is arranged inside a vacuum chamber of the nano-patterned system, the magnetic poles are oppositely arranged inside the vacuum chamber relative to the sample stage, the coil and the magnetic conductive soft iron core are arranged outside the vacuum chamber, the magnetic conductive soft iron core leads the magnetic field generated by the coil into the vacuum chamber, and the magnetic poles are used for locating a sample on the sample stage and applying a local magnetic field.

In the magnetic-field applying device, the magnetic poles are of a telescopic structure, and said magnetic poles of a telescopic structure, oppositely arranged relative to the sample stage, each have an extended position and a retracted position.

In the magnetic-field applying device, each of the magnetic poles is connected to an end of the magnetic conductive soft iron core via a corrugated tube, and said magnetic poles, oppositely arranged relative to the sample stage, each have an extended position and a retracted position.

In the magnetic-field applying device, the magnetic poles are of a probe structure which has a tip with a downward curving arc.

In the magnetic-field applying device, the magnetic poles are of a flake structure to apply a large-scale homogeneous magnetic field, and the upper surface of each said magnetic pole of a flake structure has a cambered surface which is concave downward.

In the magnetic-field applying device, the magnetic-field applying device further comprises an electric-field applying device which includes an electric-field applying power supply and insulators, each said insulator is arranged between the magnetic conductive soft iron core and the magnetic pole, and the electric-field applying power supply is connected to both of the magnetic poles, so as to locate the sample and apply a local electric field.

In the magnetic-field applying device, the electric-field applying power supply supplies a DC or AC voltage so as to apply a DC or AC electric field.

In the magnetic-field applying device, all of the magnetic conductive soft iron core and the magnetic poles are made from a non-magnetic material with magnetic permeability to reduce the stray field inside the vacuum chamber.

In the magnetic-field applying device, the tip of the magnetic pole is of a planar structure, a spherical structure, or a structure with a concave cambered surface.

To achieve the above object more efficiently, the present invention further provides a nano-patterned system comprising a vacuum chamber, a sample stage and a magnetic-field applying device, the sample stage being arranged inside the vacuum chamber, and the magnetic-field applying device being arranged relative to the sample stage, wherein the magnetic-field applying device is as defined above.

With the foregoing and other objects in view, there is provided, a magnetic-field applying device of a nano-patterned system, comprising a power supply, a vacuum chamber, a magnetic-field generation device, a pair of magnetic poles, and an electric-field applying device. The magnetic-field generation device comprises a coil and a magnetic conductive soft iron core. The power supply is connected to the coil. The coil is wound on the magnetic conductive soft iron core to generate a magnetic field. The magnetic conductive soft iron core is of a semi-closed frame structure having two ends. The magnetic poles are respectively disposed at the two ends of the semi-closed frame structure. A sample stage is inside the vacuum chamber. The magnetic poles are opposite one another inside the vacuum chamber with respect to the sample stage. The coil and the magnetic conductive soft iron core are outside the vacuum chamber. The magnetic conductive soft iron core leads the magnetic field generated by the coil into the vacuum chamber. The magnetic poles locate a sample on the sample stage and apply a local magnetic field. The electric-field applying device comprises an electric-field applying power supply and insulators. Each of the insulators is disposed between the magnetic conductive soft iron core and a respective one of the magnetic poles. The electric-field applying power supply is connected to both of the magnetic poles to locate the sample and apply a local electric field.

In accordance with another feature, the magnetic poles are of a telescopic structure oppositely disposed with respect to the sample stage and each have an extended position and a retracted position.

In accordance with a further feature, the magnetic poles are of a probe structure having a tip with a downward curving arc.

In accordance with an added feature, the magnetic poles are of a flake structure to apply a large-scale homogeneous magnetic field, the upper surface of each of the magnetic poles having a cambered surface which is concave downward.

In accordance with an additional feature, the electric-field applying power supply supplies a DC or AC voltage so as to apply a DC or AC electric field.

In accordance with yet another feature, all of the magnetic conductive soft iron core and the magnetic poles are of a non-magnetic material with magnetic permeability to reduce the stray field inside the vacuum chamber.

In accordance with yet a further feature, the magnetic pole has a tip with a planar structure, a spherical structure, or a structure with a concave cambered surface.

With the objects in view, there is also provided a nano-patterned system comprising a vacuum chamber, a sample stage, and a magnetic-field applying device. The sample stage is inside the vacuum chamber and the magnetic-field applying device is disposed relative to the sample stage. The magnetic-field applying device is defined from one of the above features.

Hereinafter, the unity model is described in detail with reference to the accompanying drawings and embodiments, which, however, are not used to limit the unity model.

The following are the relevant drawing reference signs:
1 Vacuum chamber
2 Sample stage
3 Magnetic-field applying device
  31 Power supply
  32 Magnetic-field generation device
    321 Coil
    322 Magnetic conductive soft iron core
  33 Magnetic pole
    331 Arc
    332 Cambered surface
  34 Corrugated tube
  35 Electric-field generation device
    351 Electric-field applying power supply
    352 Insulator
4 Sample

DETAILED DESCRIPTION OF THE EMBODIMENTS

Figure 1:
FIG. 1 is a block diagram of an exemplary embodiment of a nano-patterned system.

The structural principle and working principle of the present invention are specifically described hereinafter with reference to the accompanying drawings:

Referring to FIG. 1, which is a structure diagram of a nano-patterned system according to the present invention, the nano-patterned system according to the present invention comprises a vacuum chamber 1, a sample stage 2 and a magnetic-field applying device 3, wherein the sample stage 2 is arranged inside the vacuum chamber 1, and the magnetic-field applying device 3 is arranged relative to the sample stage 2. Since the structures and functions of the other parts of the nano-patterned system as well as the positional relationship, connection relationship and other relationships among them belong to existing technologies which are relatively mature, the details are not repeated here. Next, only the magnetic-field applying device 3 according to the present invention will be described in detail.

Figure 2A:
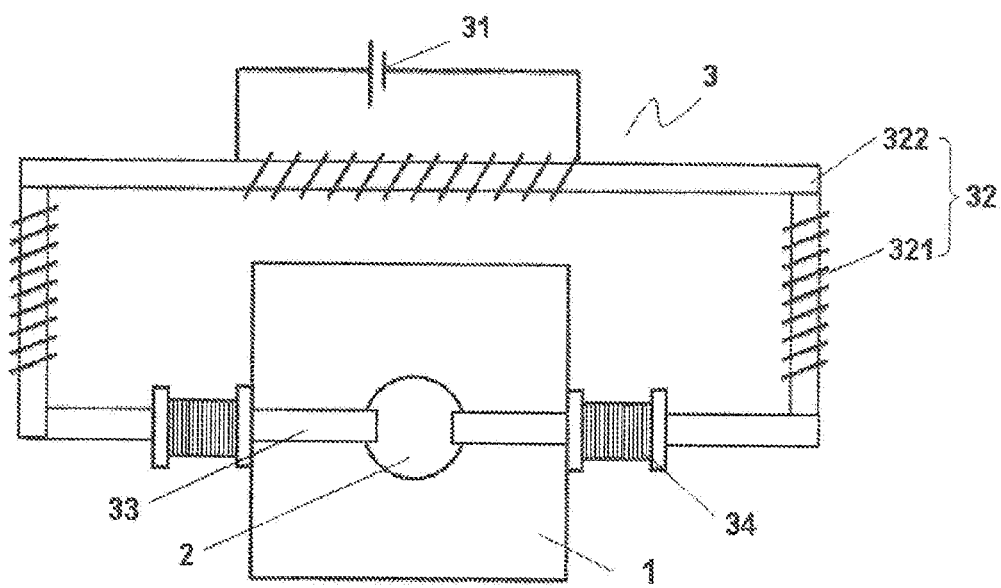
FIG. 2A is a partially schematic diagram of an exemplary embodiment of a magnetic-field applying device in an extended position.
Figure 2B:
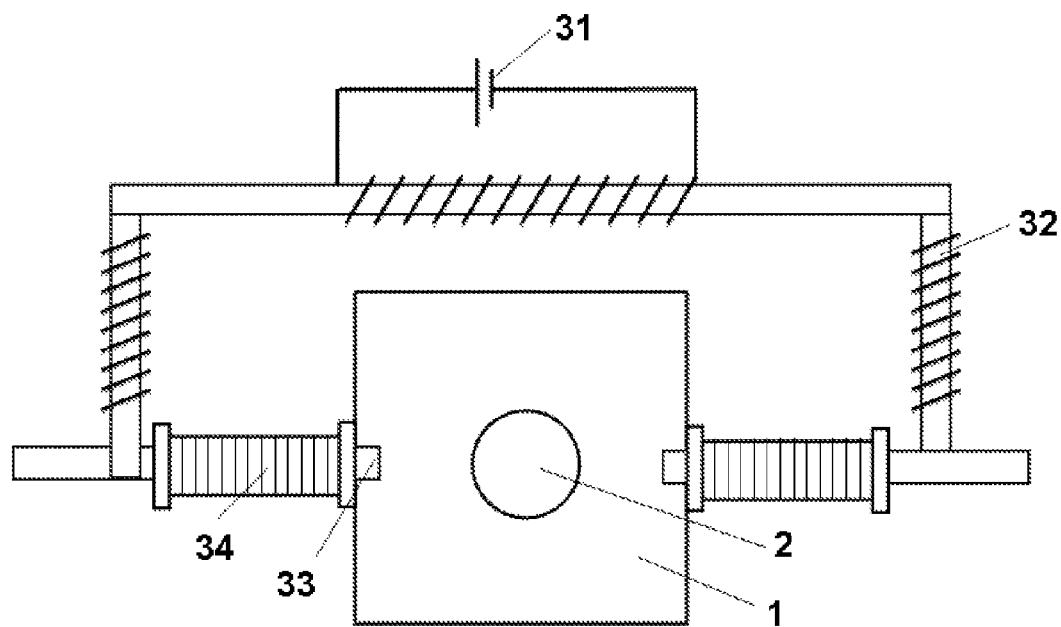
FIG. 2B is a partially schematic diagram of a non-operating state of the magnetic-field applying device of FIG. 2A in a retracted position.
Figure 2C:
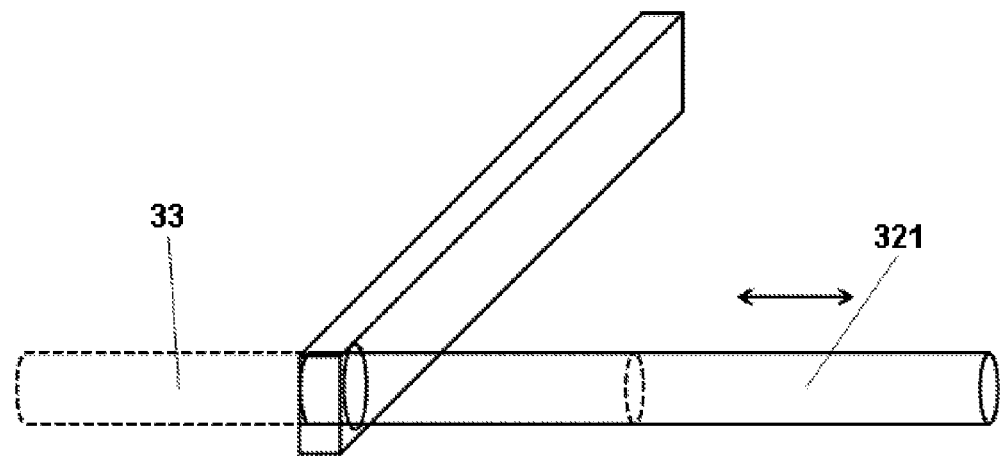
FIG. 2C is a fragmentary diagram of an exemplary embodiment of magnetic poles.
Figure 3A:
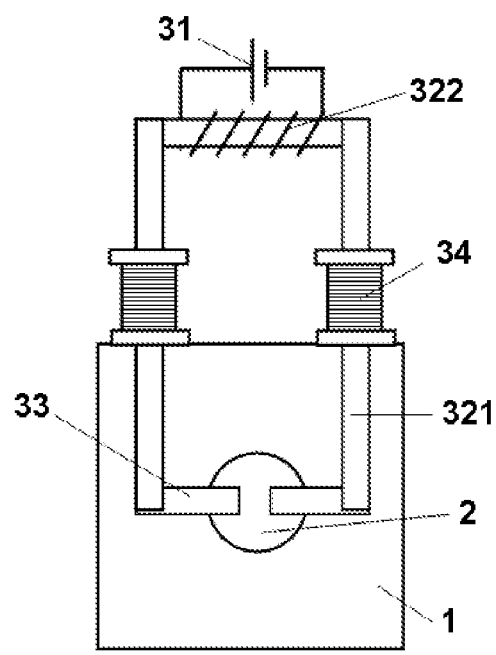
FIG. 3A is a partially schematic diagram of an exemplary embodiment of a magnetic-field applying device in an extended position.
Figure 3B:
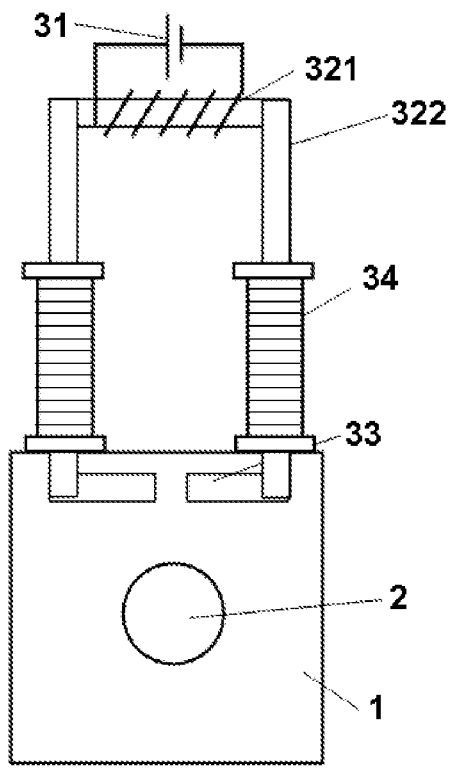
FIG. 3B is a partially schematic diagram of a non-operating state of the magnetic-field applying device of FIG. 3A in a retracted position.
Figure 4A:
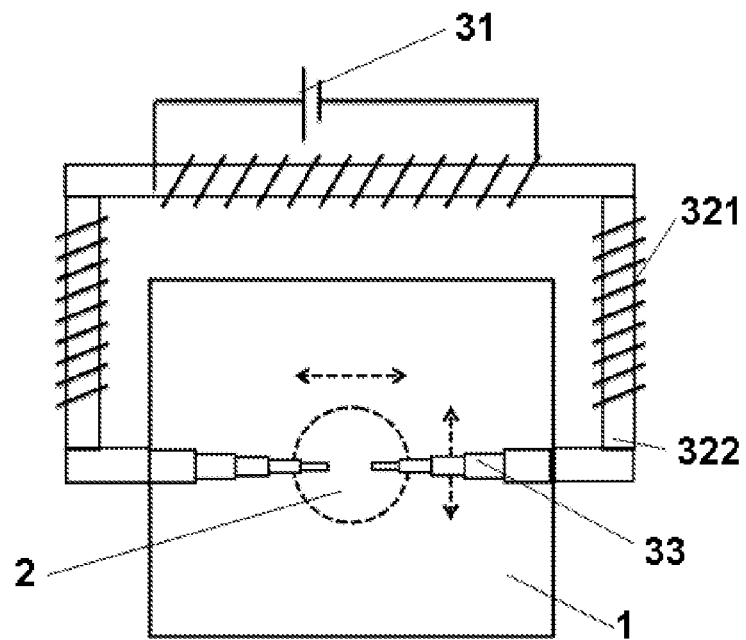
FIG. 4A is a partially schematic diagram of an exemplary embodiment of a magnetic-field applying device in an extended position.
Figure 4B:
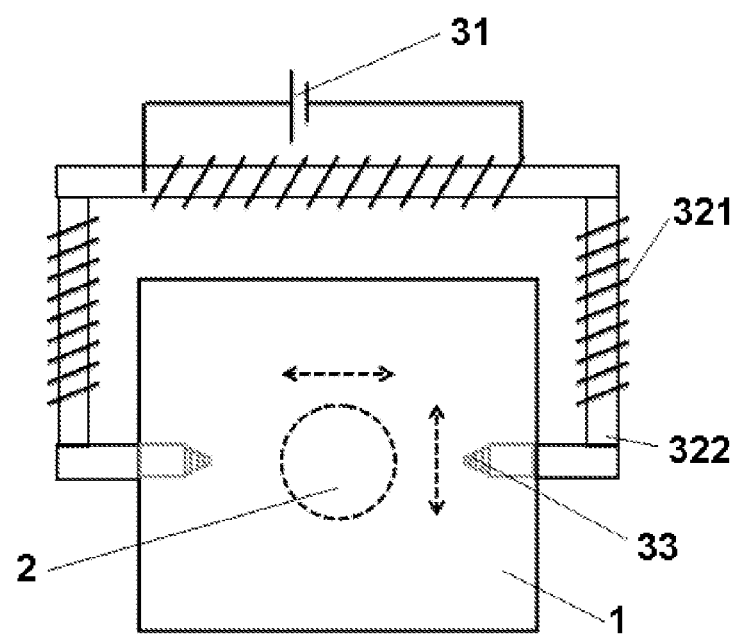
FIG. 4B is a partially schematic diagram of a non-operating state of the magnetic-field applying device of FIG. 4A in a retracted position.

Referring to FIGS. 2A to 4B, wherein FIG. 2A is a schematic diagram of a magnetic-field applying device according to an example of the present invention (extended position), FIG. 2B is a schematic view of a non-operating state of FIG. 2A (retracted position), FIG. 3A is a schematic diagram of a magnetic-field applying device according to another example of the present invention (extended position), FIG. 3B is a schematic view of a non-operating state of FIG. 3A (retracted position), FIG. 4A is a schematic diagram of a magnetic-field applying device according to a further example of the present invention (extended position), and FIG. 4B is a schematic view of a non-operating state of FIG. 4A (retracted position). The magnetic-field applying device 3 according to the present invention comprises a power supply 31, a magnetic-field generation device 32 and a pair of magnetic poles 33, wherein the magnetic-field generation device 32 comprises a coil 321 and a magnetic conductive soft iron core 322, the power supply 31 is connected to the coil 321, the coil 321 is wound on the magnetic conductive soft iron core 322 to generate a magnetic field, the magnetic conductive soft iron core 322 is of a semi-closed or quasi-closed frame structure, the magnetic poles 33 are respectively arranged at the two ends of the semi-closed frame structure, and the magnetic poles 33 and the magnetic conductive soft iron core 322 together form a closed loop circuit so that magnetic field lines are in a closed state. The magnetic field is generated by a Helmholtz coil 321 on the magnetic conductive soft iron core 322, and led into the vacuum chamber 1 via the magnetic conductive soft iron core 322. A sample stage 2 is arranged inside the vacuum chamber 1 of the nano-patterned system, the magnetic poles 33 are oppositely arranged inside the vacuum chamber 1 relative to the sample stage 2, the coil 321 and the magnetic conductive soft iron core 322 are arranged outside the vacuum chamber 1, the magnetic conductive soft iron core 322 leads the magnetic field generated by the coil 321 into the vacuum chamber 1, and the magnetic poles 33 are used for locating a sample 4 on the sample stage 2 and applying a local magnetic field.

Figure 7:
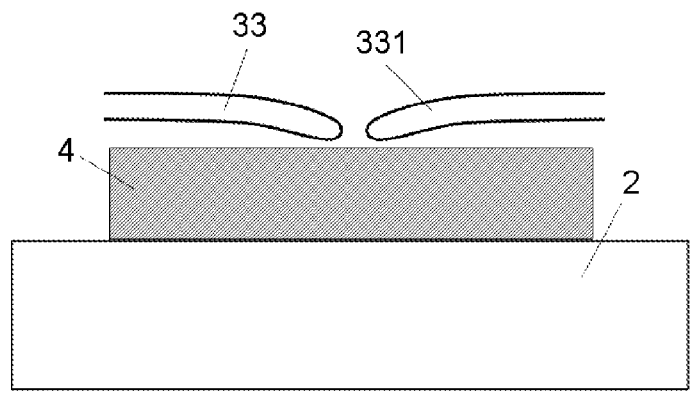
FIG. 7 is a fragmentary diagram of an exemplary embodiment of magnetic poles.

In this embodiment, the magnetic poles 33 are of a telescopic structure, and said magnetic poles 33 of a telescopic structure, oppositely arranged relative to the sample stage 2, each have an extended position and a retracted position. In addition, each of the magnetic poles 33 is connected to an end of the magnetic conductive soft iron core 322 via a corrugated tube 34, and said magnetic poles 33, oppositely arranged relative to the sample stage 2, each have an extended position and a retracted position. Referring to FIG. 7, which is a schematic diagram of magnetic poles according to an example of the present invention, the magnetic poles 33 preferably are of a probe structure which has a tip with a downward curving arc 331. Or, referring to FIG. 8, which is a schematic diagram of magnetic poles according to another example of the present invention, the magnetic poles 33 may be of a flake structure to apply a large-scale homogeneous magnetic field, and the upper surface of each said magnetic pole 33 of a flake structure has a cambered surface 332 which is concave downward. All of the magnetic conductive soft iron core 322 and the magnetic poles 33 are made from a non-magnetic material with magnetic permeability, or a soft magnetic material with a very small remanence, to reduce the stray field inside the vacuum chamber 1. The soft magnetic material can be an NiFe alloy, a silicon steel disc, or soft magnetic ferrite. Referring to FIGS. 9A to 9C, which are schematic diagrams of magnetic pole tips according to the present invention, the tip of the magnetic pole 33 is of a planar structure, a spherical structure, or a structure with a concave cambered surface 332.

Referring to FIGS. 2A to 2C, a magnetic field of a desired size can be generated by applying an appropriate electric current to the coil 321. The magnetic field is led into an SEM or EBL chamber via the magnetic conductive soft iron core 322 to form a closed magnetic circuit. Since the SEM or EBL chamber is in vacuum, the portion of the chamber wall where the magnetic conductive soft iron core 322 penetrates through is sealed with a corrugated tube 34. The magnetic-field applying structure at the tip of the magnetic conductive soft iron core 322 inside the chamber includes a pair of magnetic poles 33. A magnetic field generated by the coil 321 outside the chamber is led via the magnetic conductive soft iron core 322 onto the tips of the pair of magnetic poles 33, so a phase magnetic field is generated on the sample 4. The two magnetic poles 33 can move back and forth mechanically and are capable of adjusting the region to which a magnetic field is applied. When there is no need to apply a magnetic field, the two magnetic poles 33 respectively withdraw to the two sides of the vacuum chamber 1. The specific configuration of the movable magnetic pole 33 is shown in FIG. 2C. Part of the movable magnetic pole 33 is nested inside the magnetic conductive soft iron core 322 to ensure a close contact between the two, so that the leakage of magnetic lines of force can be avoided effectively. The coil 321 is a wound conductive wire with high electrical conductivity. The conductive wire diameter is 0.2 to 2 mm, and the number of turns and the diameter of the coil 321 can be determined according to the desired magnetic field. Periphery of the coil 321 can be cooled by wrapping it with a circulating water jacket (not illustrated). Said soft magnetic material is a material characterized by high permeability and small remanence. Pure iron and low carbon steel, Fe—Si alloys, Fe—Al alloys, Fe—Si—Al alloys, Ni—Fe alloys, Fe—Co alloys, soft magnetic ferrite, amorphous soft magnetic alloys, and nanocrystalline soft magnetic alloys with a particle size of about 50 nm are preferred.

Referring to FIGS. 3A and 3B, an appropriate electric current is applied to the coil 321, thus generating a magnetic field of a desired size. The magnetic field is led into a SEM or EBL chamber via the magnetic conductive soft iron core 322 to form a closed magnetic circuit. When there is no need to apply a magnetic field, the two magnetic poles 33 simultaneously withdraw to the one side of the vacuum chamber 1. The advantage of such configuration is that, when there is no need to apply a magnetic field, the magnetic conductive soft iron core 322 and the magnetic poles 33 still form a closed magnetic circuit, thus effectively avoiding the leakage of remanence. Similarly, the portion of the chamber wall where the magnetic conductive soft iron core 322 or the magnetic pole 33 penetrates through is sealed with a corrugated tube, as shown in the figures.

Referring to FIGS. 4A and 4B, an appropriate electric current is applied to the coil 321, thus generating a magnetic field of a desired size. The magnetic field is led into a SEM or EBL chamber via the magnetic conductive soft iron core 322 to form a closed magnetic circuit. The magnetic poles 33 in this embodiment are of a telescopic structure. When there is no need to apply a magnetic field, the two magnetic poles 33 simultaneously withdraw to the two sides of the vacuum chamber 1. The advantage of such configuration is that, when there is no need to apply a magnetic field, the two magnetic poles 33 retract, thus effectively saving the space inside the vacuum chamber 1.

Figure 5:
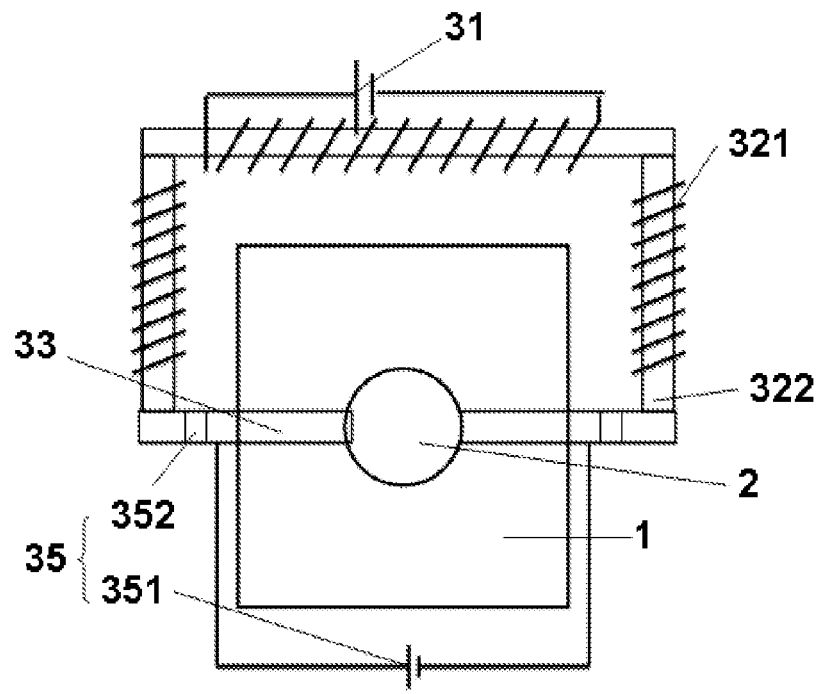
FIG. 5 is a partially schematic diagram of an exemplary embodiment of a magnetic-field applying device in an extended position.
Figure 6A:
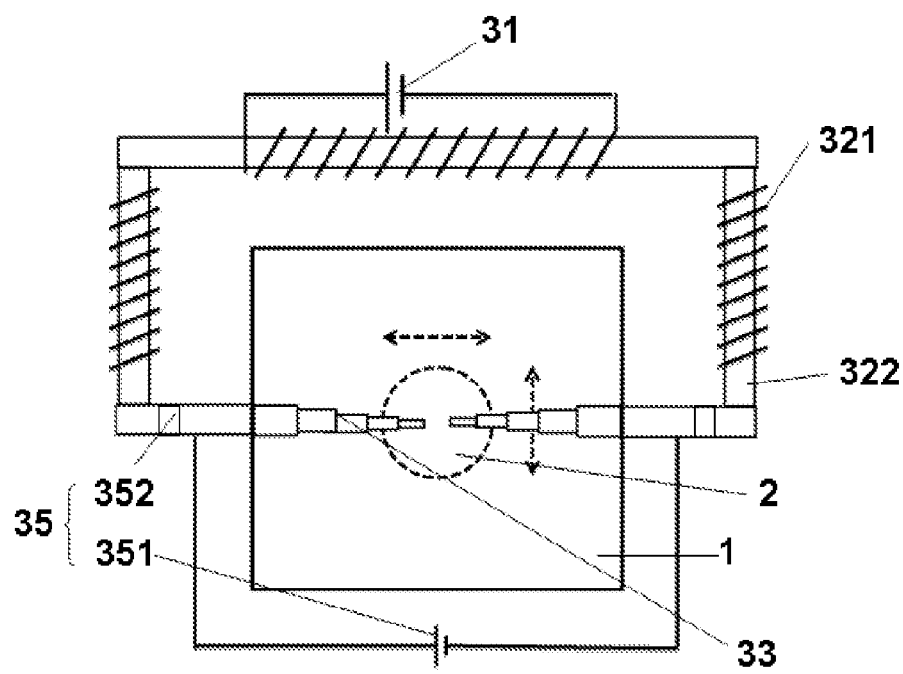
FIG. 6A is a partially schematic diagram of an exemplary embodiment of a magnetic-field applying device in an extended position.
Figure 6B:
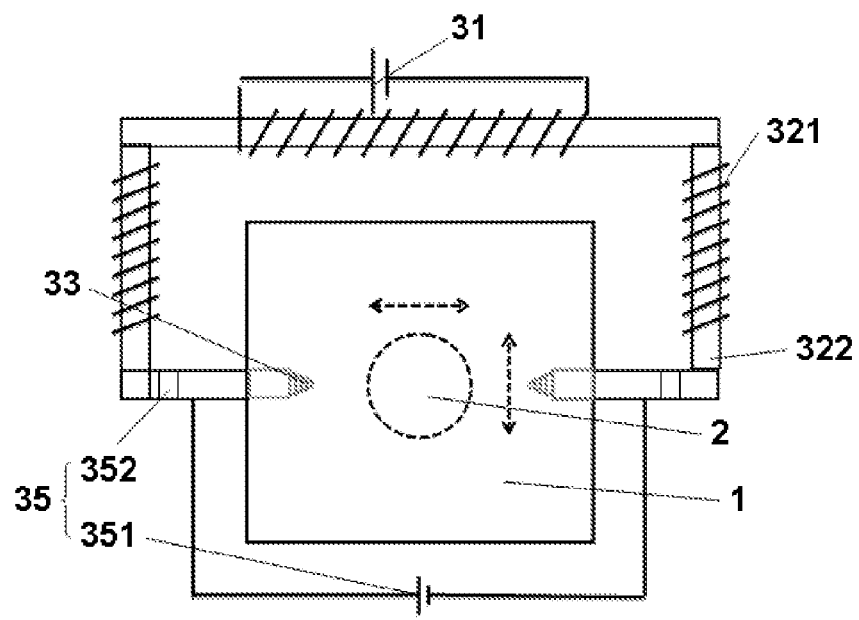
FIG. 6B is a partially schematic diagram of a non-operating state of the magnetic-field applying device of FIG. 6A in a retracted position.

Referring to FIGS. 5 to 6B, FIG. 5 is a schematic diagram of a magnetic-field applying device according to a further example of the present invention (extended position), FIG. 6A is a schematic diagram of a magnetic-field applying device according to a further example of the present invention (extended position), and FIG. 6B is a schematic view of a non-operating state of FIG. 6A (retracted position). In this embodiment, the magnetic-field applying device 3 further comprises an electric-field applying device 35 which includes an electric-field applying power supply 351 and insulators 352, wherein each said insulator 352 is arranged between the magnetic conductive soft iron core 322 and the magnetic pole 33, and the electric-field applying power supply 351 is connected to both of the magnetic poles 33, so as to locate the sample and apply a local electric field. The electric-field applying power supply 351 supplies a DC or AC voltage so as to apply a DC or AC electric field. Even for flexible, thin insulators 352, a magnetic field in a valid closed state still can be formed. Meanwhile, due to the insulators 352 disposed therein, the magnetic-field applying device 3 can apply an electric field at the same time. The magnetic conductive soft iron core 322 is made of a non-magnetic metal material with high permeability, thus it is able to apply a magnetic field. In the case where no magnetic field is applied, the magnetic conductive soft iron core 322, which is in a non-magnetic metallic state, is also able to apply an electric field. In addition, when no magnetic field is applied, the magnetic conductive soft iron core 322 made of a non-magnetic metal material with high permeability has almost zero remanence, thus minimizing the impact on the original function of SEM or EBL.

Referring to FIG. 5, the electric-field applying device 35 is added in this embodiment, wherein the insulators 352 will not affect the closed state of the magnetic circuit. An appropriate electric current is applied to the Helmholtz coil 321, thus generating a magnetic field of a desired size. The magnetic field is led into a SEM or EBL chamber via the magnetic conductive soft iron core 322 to form a closed magnetic circuit. Since the SEM or EBL chamber is vacuum, the portion of the chamber wall where the magnetic conductive soft iron core 322 penetrates through is sealed with a corrugated tube. A magnetic field generated by the coil 321 outside the chamber is led via the magnetic conductive soft iron core 322 onto the tips of the pair of magnetic poles 33, and applied to a local region. But beyond that, due to the presence of the insulators 352, the two magnetic poles 33 at the top can also be used to apply an electric field. The two magnetic poles 33, which are respectively connected to the positive and negative electrodes of the electric-field applying power supply 351, form magnetic lines of force at the tips of the magnetic poles 33 and apply them to the local region. The two magnetic poles 33 can move back and forth mechanically and are capable of adjusting the region to which an electric field is applied. The magnetic poles 33 are of a telescopic structure, so that they are able to apply a local magnetic field and a local electric field, as shown in FIGS. 6A and 6B. When there is no need to apply an electric field, the two magnetic poles 33 simultaneously withdraw to the two sides of the chamber. The advantage of such configuration is that, when there is no need to apply an electric field, the two magnetic poles 33 retract, thus effectively saving the space inside the chamber.

Figure 8:
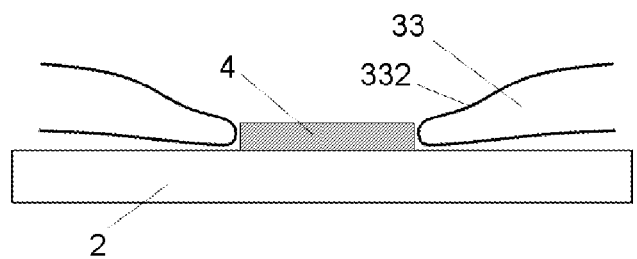
FIG. 8 is a fragmentary diagram of another exemplary embodiment of magnetic poles.
Figure 9A:
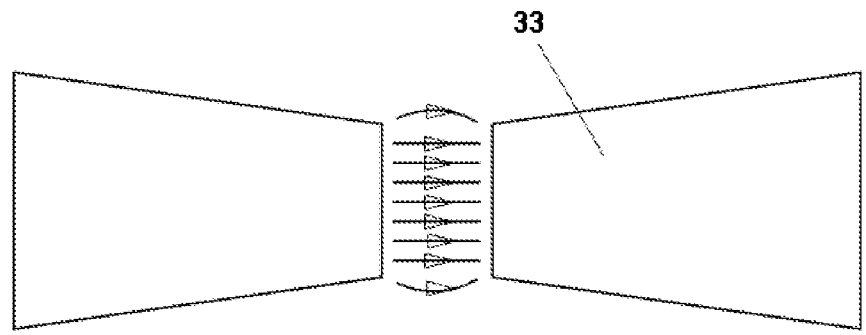
FIGS. 9A to 9C are fragmentary diagrams of exemplary embodiments of magnetic pole tips.
Figure 9B:
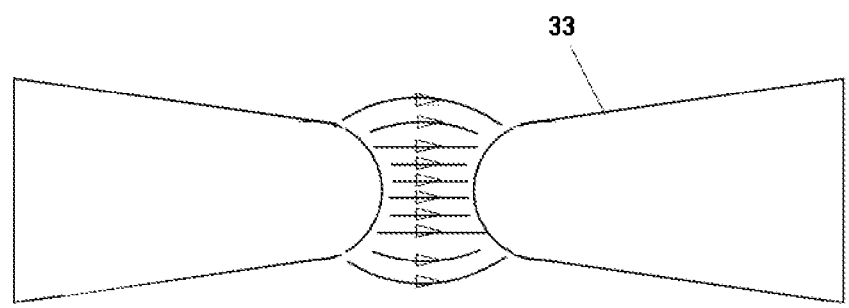
Figure 9C:
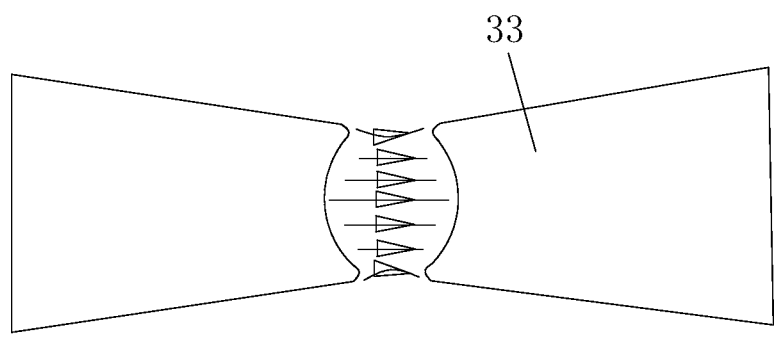

Referring to FIGS. 7 and 8, the magnetic poles 33 that generate a magnetic field may be of a non-probe or probe structure. The magnetic poles 33 of a flake structure as shown in FIG. 8 can apply a large-scale homogeneous magnetic field. What is illustrated in FIG. 7 is a probe structure, wherein the probe may have a tip of a small size so that it is able to apply a local magnetic field to the sample 4. The two magnetic poles 33 can move back and forth mechanically and are capable of adjusting the region to which a magnetic field is applied. Since the SEM or EBL chamber is vacuum, the portion of the chamber wall where the magnetic conductive soft iron core 322 or the magnetic pole 33 penetrates through is sealed with a corrugated tube.

Referring to FIGS. 9A to 9C, the tip of the magnetic pole 33 for applying a magnetic field may be of a planar structure, a spherical structure, or a structure with a concave cambered surface, as shown in the figures. Different structures provide different distributions of stray magnetic field around the tip. After calculation, it is clear that the stray magnetic field generated at the tip in FIG. 9C is the smallest. To apply a magnetic field required to have a reduced stray magnetic field, the tip structure shown in FIG. 9C may be adopted. Also, calculations show that the magnetic field generated by the structure shown in FIG. 9A has the largest homogeneous region. When there is a need to measure a large homogeneous region, the tip structure shown in FIG. 9A may be adopted.

The magnetic-field applying device according to the present invention is able to introduce not only a large-scale magnetic/electric field but also a large-scale or local magnetic/electric field, and it can be widely used for applying a magnetic/electric field in SEM or EBL and other apparatus. Therefore, it can be widely used not only in the fields of the measurement and study of semiconductor, microelectronic, magneto-electronic and spinning electronics materials and the devices thereof, but also in the batch testing and quality control of the related electronic products in the information industry.

Of course, the present invention may have a variety of other embodiments. Those skilled in the art can make all kinds of corresponding changes and modifications according to the present invention without departing from the spirit and essence of the present invention. It is intended that all these changes and modifications be covered by the appended claims of the present invention.

INDUSTRIAL APPLICABILITY

The present invention can be used for introducing a large-scale or local magnetic/electric field. It can reduce the space that a magnetic-field applying device occupies inside a SEM or EBL chamber, thereby reducing the complexity of the mechanical structure inside the chamber; it can confine the magnetic field to a local region, thereby minimizing the impact of the magnetic/electric field on the original system; it is advantageous to locate the region to be measured; and it can be used to study the local properties of the sample to be measured. Compared with the magnetic-field applying devices employed in the SEM or EBL systems of the prior art, the present invention allows a magnetic field, which has a minimal impact on the function of SEM or EBL, to be applied more effectively and accurately, thus it can be used to quickly and efficiently apply magnetic fields in the tests and studies of nano materials and devices as well as the array samples thereof. Therefore, the present invention can be widely used in many fields and meet the extensive market demands.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure.

The phrase "at least one of A and B" is used herein and/or in the following claims, where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables.

We claim:

1. A magnetic-field applying device of a nano-patterned system, comprising:
   a power supply;
   a vacuum chamber;
   a magnetic-field generation device;
   a pair of magnetic poles, wherein:
      the magnetic-field generation device comprises a coil and a magnetic conductive soft iron core;
      the power supply is connected to the coil;
      the coil is wound on the magnetic conductive soft iron core to generate a magnetic field;
      the magnetic conductive soft iron core is of a semi-closed frame structure having two ends;
      the magnetic poles are respectively disposed at the two ends of the semi-closed frame structure;
      a sample stage is inside the vacuum chamber;
      the magnetic poles are opposite one another inside the vacuum chamber with respect to the sample stage;
      the coil and the magnetic conductive soft iron core are outside the vacuum chamber;
      the magnetic conductive soft iron core leads the magnetic field generated by the coil into the vacuum chamber; and
      the magnetic poles locate a sample on the sample stage and apply a local magnetic field; and
   an electric-field applying device comprises an electric-field applying power supply and insulators, each of the insulators being disposed between the magnetic conductive soft iron core and a respective one of the magnetic poles, the electric-field applying power supply being connected to both of the magnetic poles to locate the sample and apply a local electric field.

2. The magnetic-field applying device according to claim 1, wherein the magnetic poles are of a telescopic structure oppositely disposed with respect to the sample stage and each have an extended position and a retracted position.

3. The magnetic-field applying device according to claim 1, wherein the magnetic poles are of a probe structure having a tip with a downward curving arc.

4. The magnetic-field applying device according to claim 1, wherein the magnetic poles are of a flake structure to apply a large-scale homogeneous magnetic field, the upper surface of each of the magnetic poles having a cambered surface which is concave downward.

5. The magnetic-field applying device according to claim 1, wherein the electric-field applying power supply supplies a DC or AC voltage so as to apply a DC or AC electric field.

6. The magnetic-field applying device according to claim 1, wherein all of the magnetic conductive soft iron core and the magnetic poles are of a non-magnetic material with magnetic permeability to reduce the stray field inside the vacuum chamber.

7. The magnetic-field applying device according to claim 5, wherein all of the magnetic conductive soft iron core and the magnetic poles are of a non-magnetic material with magnetic permeability to reduce the stray field inside the vacuum chamber.

8. The magnetic-field applying device according to claim 1, wherein the magnetic pole has a tip with a planar structure, a spherical structure, or a structure with a concave cambered surface.

9. The magnetic-field applying device according to claim 5, wherein the magnetic pole has a tip with a planar structure, a spherical structure, or a structure with a concave cambered surface.

10. A nano-patterned system comprising:
    a vacuum chamber;
    a sample stage; and
    a magnetic-field applying device, the sample stage being inside the vacuum chamber and the magnetic-field applying device being disposed relative to the sample stage, wherein the magnetic-field applying device is as defined in claim 1.

11. A nano-patterned system comprising:
    a vacuum chamber;
    a sample stage; and
    a magnetic-field applying device, the sample stage being inside the vacuum chamber and the magnetic-field applying device being disposed relative to the sample stage, wherein the magnetic-field applying device is as defined in claim 5.

12. A nano-patterned system comprising:
    a vacuum chamber;
    a sample stage; and
    a magnetic-field applying device, the sample stage being inside the vacuum chamber and the magnetic-field applying device being disposed relative to the sample stage, wherein the magnetic-field applying device is as defined in claim 7.

13. A nano-patterned system comprising:
    a vacuum chamber;
    a sample stage; and
    a magnetic-field applying device, the sample stage being inside the vacuum chamber and the magnetic-field applying device being disposed relative to the sample stage, wherein the magnetic-field applying device is as defined in claim 9.

* * * * *